US009608219B2

(12) United States Patent
Mustonen et al.

(10) Patent No.: US 9,608,219 B2
(45) Date of Patent: Mar. 28, 2017

(54) SEMICONDUCTOR STRUCTURE AND METHOD FOR ITS PRODUCTION

(71) Applicant: BASF SE, Ludwigshafen (DE)

(72) Inventors: Tero Mustonen, Binningen (CH); Roger Pretot, Basel (CH); Tomi Hassinen, Vantaa (FI)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/844,800

(22) Filed: Sep. 3, 2015

(65) Prior Publication Data

US 2016/0072084 A1 Mar. 10, 2016

Related U.S. Application Data

(63) Continuation of application No. 13/988,392, filed as application No. PCT/EP2011/073159 on Dec. 19, 2011, now abandoned.
(Continued)

(30) Foreign Application Priority Data

Dec. 22, 2010 (EP) .................................. 10196429

(51) Int. Cl.
*H01L 51/50* (2006.01)
*H01L 51/05* (2006.01)
(Continued)

(52) U.S. Cl.
CPC .......... *H01L 51/057* (2013.01); *C09B 57/004* (2013.01); *C09B 69/109* (2013.01);
(Continued)

(58) Field of Classification Search
None
See application file for complete search history.

(56) References Cited

U.S. PATENT DOCUMENTS 6,451,459 B1 9/2002 Tieke et al.
8,563,855 B2 10/2013 Pschirer et al.
(Continued)

FOREIGN PATENT DOCUMENTS

EP 2 034 537 3/2009
JP 2004-335557 A 11/2004
(Continued)

OTHER PUBLICATIONS

International Search Report Issued Mar. 8, 2012 in PCT/EP11/73159 Filed Dec. 19, 2011.
(Continued)

*Primary Examiner* — Whitney T Moore
(74) *Attorney, Agent, or Firm* — Oblon, McClelland, Maier & Neustadt, L.L.P.

(57) ABSTRACT

The present invention relates to a semiconductor structure and a method for its production, the semiconductor structure comprising at least one conductor region and at least two semiconductor regions, which semiconductor regions are partly separated by the at least one conductor region. The at least one conductor region comprises openings extending between the semiconductor regions which are partly separated by the respective conductor region. The semiconductor regions comprise at least one organic semiconductor material having a specific HOMO energy level, in particular a DPP polymer. The conductor region comprises a conductive material having a specific work function, said combination of specific energy level and work function allowing for a simple preparation of the conductive region. The invention further relates to a method for providing such a semiconductor structure.

16 Claims, 1 Drawing Sheet

Related U.S. Application Data

(60) Provisional application No. 61/425,777, filed on Dec. 22, 2010.

(51) Int. Cl.
*C09B 57/00* (2006.01)
*C09B 69/10* (2006.01)
*H01L 51/00* (2006.01)

(52) U.S. Cl.
CPC ...... *H01L 51/0508* (2013.01); *H01L 51/0036* (2013.01); *H01L 51/0043* (2013.01)

(56) References Cited

U.S. PATENT DOCUMENTS

| | | |
|---|---|---|
| 2003/0015698 A1 | 1/2003 | Baldo et al. |
| 2005/0196895 A1 | 9/2005 | Baldo et al. |
| 2006/0086933 A1 | 4/2006 | Iechi et al. |
| 2008/0128681 A1* | 6/2008 | Meng ................ H01L 51/0504 257/40 |
| 2009/0001362 A1 | 1/2009 | Toguchi et al. |
| 2009/0042142 A1 | 2/2009 | Baldo et al. |
| 2009/0065878 A1 | 3/2009 | Li |
| 2009/0181513 A1 | 7/2009 | Meng et al. |
| 2011/0240981 A1 | 10/2011 | Dueggeli et al. |
| 2012/0313453 A1 | 12/2012 | Mustonen |

FOREIGN PATENT DOCUMENTS

| | | |
|---|---|---|
| WO | 2005 049695 | 6/2005 |
| WO | 2008 000664 | 1/2008 |
| WO | WO 2009/157284 A1 | 12/2009 |
| WO | 2010 049321 | 5/2010 |
| WO | 2010 049323 | 5/2010 |
| WO | 2010 108873 | 9/2010 |
| WO | 2010 115767 | 10/2010 |
| WO | 2010 136352 | 12/2010 |
| WO | 2010 136353 | 12/2010 |
| WO | 2011/036110 A1 | 3/2011 |
| WO | 2011 161078 | 12/2011 |
| WO | 2012/084757 A1 | 6/2012 |
| WO | 2012/095796 A1 | 7/2012 |

OTHER PUBLICATIONS

Yu Chiang Chao, et al., "High-performance solution-processed polymer, space-charge-limited transistor", Organic Electronics, 9, 2008, pp. 310-316.

Yu-Chiang Chao et al., "Polymer space charge-limited transistor", Applied Physics letters, vol. 86, No. 22, Jun. 2, 2006, XP012061977, pp. 223510-1-223510-3.

Olga Lobanova Griffith, et al., "Electronic Properties of Pentacene versus Triisopropylsitylethnyl-Substituted Pentacene: Environment-Dependent Effects of the Silyl Substituent", Journal of the American Chemical Society, vol. 132, XP-002638569, Dec. 15, 2009, pp. 508-586.

Yasuyuki Watanabe et al. "Characteristics of organic inverters using vertical- and lateral-type organic transistors", Thin Solid Films, vol. 516, No. 9, Feb. 22, 2008, XP022494822, pp. 2731-2734.

English translation of the Notification of Reasons for Refusal issued Feb. 15, 2016 in Japanese Patent Application No. 2013-545237.

* cited by examiner

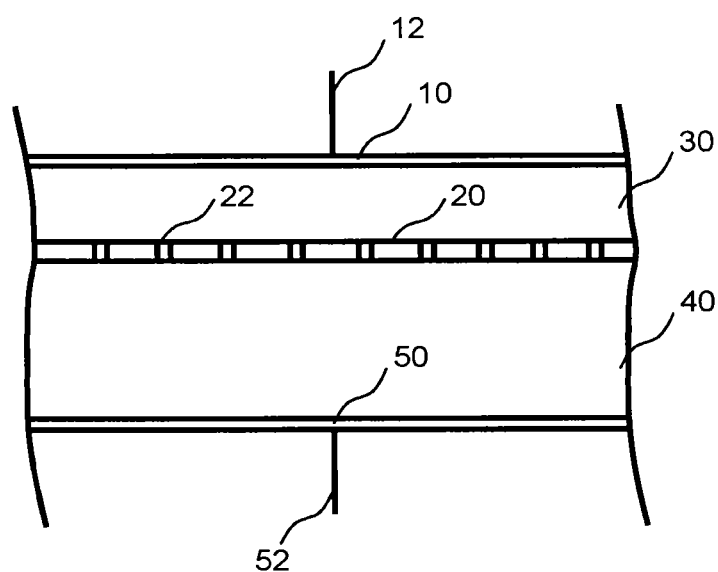

SEMICONDUCTOR STRUCTURE AND METHOD FOR ITS PRODUCTION

This application is a Continuation of U.S. application Ser. No. 13/988,392, which was filed on May 20, 2013, application Ser. No. 13/988,392 is a National Stage of PCT/EP2011/073159, which was filed on Dec. 19, 2011, and claims the benefit of priority to U.S. Provisional Application No. 61/425,777, which was filed on Dec. 22, 2010. This application is based upon and claims the benefit of priority to European Application No. 10 196 429.4, which was filed on Dec. 22, 2010.

The present invention relates to the field of organic semiconductor structures, in particular to the field of vertical semiconductor structures based on diketopyrrolopyrrole (DPP) polymers. In particular, the present invention relates to a semiconductor structure and a method for its production, the semiconductor structure comprising at least one conductor region and at least two semiconductor regions, which semiconductor regions are partly separated by the at least one conductor region, wherein the at least one conductor region comprises openings extending between the semiconductor regions which are partly separated by the respective conductor region, wherein the semiconductor regions comprise at least one organic semiconductor material having a specific HOMO (highest occupied molecular orbital) energy level, in particular a DPP (diketopyrrolopyrrole) polymer, and wherein the conductor region comprises a conductive material having a specific work function.

In WO 2010/049321 and in WO 2008/000664, organic semiconductor structures are described wherein the semiconductor materials are diketopyrrolopyrrole (DPP) polymers. Further, the use of a gate insulated by a gate dielectric within the structure is generally disclosed. However, these prior art documents are silent as regards form or structure of the gates.

In US 2006/0086933 A1, an organic semiconductor structure is described having a comb-like electrode or a meshed electrode. The gate electrode is patterned based on photolithography.

In US 2009/0001362 A1, an organic semiconductor structure is described having a comb-like electrode patterned by electron-beam direct lithography.

These patterning methods of the prior art require a substantial amount of time and are not adapted for high throughput processing.

Further, in Yu-Chiang Chao et. al., "High-performance solution-processed polymer space-charge-limited transistor", Organic Electronics 9 (2008), pp. 310-316, it is described to use a conductive Al-layer with openings having a diameter of 200 nm. Due to their size, openings are formed by depositing Al and polystyrene spheres which are subsequently removed. As semiconductors, materials like poly(3-hexylthiophene) are employed. As to this technique, it is noted that the removal of the polystyrene spheres cannot be reliably realized in an automated high-throughput process. In addition, the resulting pattern is based on statistically arranged spheres. In particular, a clogging of spheres results in opening sizes depending on the number of spheres per clogged cluster, which can vary to a large extent. Therefore, the pattern cannot be determined reliably and inappropriately large opening sizes cannot be not excluded.

US-2009/0181513 A1 as well as Chao et al., Applied Physics Letters 88 (2006) 223510, introduce openings to the conductive Al-layer at size of 200 nm and 500 nm. Large openings of 200 nm and especially 500 nm show large off-current in the transistors, because the small depletion width between Al and poly(hexyl-thiophene) is insufficient to prevent charge transporting, thus resulting in large off-current and poor transistor performance.

In Yasuyuki Watanabe et. al., "Characteristics of organic inverters using vertical- and lateral-type organic transistors", Thin Solid Films 516 (2008), pp. 2731-2734, a transistor structure based on pentacene as semiconductor is shown, in which a gate within the pentacene is in form of slits. However, slits provide a periodic sequence of gate material and space in between only in one direction, i.e. perpendicular to the slits. Along the slits, gate material and the space in between are not provided in an alternating manner such that a high gate voltage sensitivity due to the gate material and a high source-drain current due to the space in between cannot be provided at the same area. This results in poor electrical properties of the transistor.

In US 2005/0196895 A1 as well as in US 2009/0042142 A1, an organic semiconductor device is shown having a perforated intermediate layer of conductive material denoted as grid. The openings of the grid are provided by a patterning die with raised portions of 50-200 nm. The grid is isolated with regard to the organic semiconductor material. As p-type semiconductor material, organic semiconductor materials like PTCDA, CuPc and a-NPD are proposed. The patterning die mechanically transfers the pattern to the semiconductor material. However, the raised portions in these sizes, 50-200 nm, cannot be provided in reliable manner due to significant tolerances of the pattering die and due to wearing and deformations of the raised portions. Thus, also electrical properties of the semiconductor device resulting from the opening size (gain, drain-source current, etc.) cannot be reproduced in reliable manner.

Therefore, it is an object of the invention to provide a semiconductor structure and a method for producing such semiconductor structure enabling reliable electrical properties and a high throughput.

Surprisingly, it was found that said object can be solved by semiconductor structure comprising at least one conductor region and at least two semiconductor regions, which semiconductor regions are partly separated by the at least one conductor region, wherein the at least one conductor region comprises openings extending between the semiconductor regions which are partly separated by the respective conductor region, wherein the semiconductor regions comprise at least one organic semiconductor material having a HOMO (highest occupied molecular orbital) energy level $E_H$, $E_H$ being defined by 5.0 eV≤$|E_H|$≤5.8 eV as determined by cyclic voltammetry (see further below), and wherein the conductor region comprises a conductive material having a work function $E_C$ being defined by $|E_H|$≤1.5 eV≤$|E_C|$≤$|E_H|$−0.4 eV.

Alternative ranges for the energy level $E_H$ are: 5.1 eV≤$|E_H|$≤5.8 eV or 5.0 eV≤$|E_H|$≤5.7 eV or, preferably, 5.1 eV≤$|E_H|$≤5.7 eV.

Each of the at least one conductor regions separates two of the at least two semiconductor regions. On each side of each conductor region, one of the semiconductor regions contacts the conductor region. The contacts between each of the conductor regions and each of the semiconductor regions are Schottky contacts.

The current of free charge carriers between the semiconductor regions separated by the at least one conductor region, can be controlled by the conductor region comprising the openings through which the free charge carriers can pass from one semiconductor region to the semiconductor region following the conductor region. Thus, the conductor region can be regarded as gate or basis of a vertical transistor formed by the semiconductor regions and the at least one conductor region. Further, the conductor region can be regarded as grid of a solid equivalent of an electron tube structure. The at least one conductor region is adapted to impose an electrical field within at least one of the semiconductor regions by which the current of free charge carriers can be controlled. Such a current of free charge carriers between at least two of the semiconductor regions is the result of a voltage applied to the semiconductor regions in the sense of a source-drain voltage, wherein the current is controlled by the voltage of the conductor region, which has the function of a gate. The gate voltage at the conducting region controls the width of the depletion region which extends to the grid opening. The width of the depletion region in turn controls the current through the opening. Particular electrical properties of the inventive semiconductor structure are the maximum bulk current density of the current through the conductor region as well as the gain defined by the dependency of the current on a control voltage or control current applied to the at least one conductive layer. It has been found that the inventive semiconductor structure exhibits significantly improved electrical properties.

Further, the improved electrical properties are achieved also in case that the structural elements of the conductive layer are provided in larger dimensions. According to the present invention, the semiconductor structure can be produced with a higher precision since the absolute influence of tolerances or deformations is reduced due to the larger gate structures. Further, a plurality of patterning mechanisms can be used, in particular patterning mechanisms adapted for larger structure dimensions only. In addition, a large depletion width can be provided by the inventive combination of materials. Due to the larger openings, the influence of tolerances is decreased, and the precision can be improved. Thus, the electrical properties linked with the structure can be defined with higher precision. As a consequence, the scrap rate of the manufactured semiconductor structures is significantly decreased.

According to the invention, the at least one conductor region is one conductor region or more than one conductor regions made of a conductive material. As conductive material, materials are denoted which have a specific electrical resistance of less than $10^4$, less than $10^3$, less than $10^2$, or of less than 10 $\Omega$m. Preferably, the conductive material has a specific electrical resistance of less than $10^{-3}$, less than $10^{-5}$, or less than $10^{-6}$ $\Omega$m. Most preferably, the specific electrical resistance of the conductive material is less than $5\times10^{-7}$ $\Omega$m or is less than $1\times10^{-7}$ $\Omega$m, particularly in the range of the specific electrical resistance of aluminum.

The conductor region is an integral region and, for each semiconductor region, all subregions of the semiconductor region are electrically connected. Further, a semiconductor region separating two conductor regions coextends with these semiconductor regions or coextends with parts of these semiconductor regions. In particular, the at least one conductor region and the at least two semiconductor regions can be stacked or be provided in a laminated structure. Within the context of the invention, the semiconductor regions are partly separated by the at least one conductor region, wherein the semiconductor regions are connected via the openings of the intermediate conductor regions. Further, the conductive material outside the openings, i.e. lateral to the openings, physically separates the respective semiconductor regions.

The openings within the at least one conductor region are preferably of the same shape and are in particular of the same cross-section. Further, the openings have preferably the same cross-sectional area. The openings are throughholes. This allows to connect semiconductor regions abutting from both sides to the conductor region. The openings extend along a direction inclined to or substantially perpendicular to a direction, along which the conductor region extends.

The semiconductor regions comprise at least one organic semiconductor material. The at least one organic semiconductor material is a p-type semiconductor and provides free positive charges. Further, the semiconductor material preferably extends through the complete width of the respective semiconductor regions. Therefore, the semiconductor regions form an integral semiconducting region. The semiconductor regions enable currents to flow through the complete width of each semiconductor region. The semiconductor regions can be provided between conductor regions or between an electrode and a conductor region. Further, the semiconductor material of at least of the semiconductor regions extends along the openings such that physical contact is given between semiconductor regions separated by a conductor region by the openings within the conductor region. This preferably applies to all conductor regions and semiconductor regions of the semiconductor structure.

The at least one conductor region and the at least two semiconductor regions preferably extend parallel to each other in a stacked fashion providing a stacked or laminated structure.

Additionally, also electrodes can be provided, which also extend parallel to the semiconductor regions and the at least one conductor region. The at least one conductor region and the at least two semiconductor regions are preferably provided as layers. Further, the conductor region extends from one of the semiconductor regions to another one of the semiconductor regions. Preferably, each of the at least one conductor region and the at least two semiconductor regions are provided with a constant thickness, wherein the thickness is given in a direction perpendicular to a direction, in which one of the regions extends.

The organic semiconductor material of the semiconductor regions has a particular energy level $E_H$ corresponding to the energy level of the highest occupied molecular orbital, which is also denoted as HOMO. The HOMO level $E_H$ reflects the affinity of the organic semiconductor material to provide free charge carriers. In particular, the HOMO level reflects the energy necessary to provide free charge carriers from the organic semiconductor material and can be compared to an excitation energy. According to the invention, the absolute value of $E_H$ is at least 5.0 eV or at least 5.1 and does not exceed 5.7 eV or 5.8 eV.

Further, the absolute value of the LUMO level, ie. the level of the lowest unoccupied molecular orbital, is preferably 3.3-4.1.

The conductive material of the conductor region according to the present invention is adapted to the energy level $E_H$ of the semiconductor material in order to provide the beneficial electrical and mechanical properties of the inventive semiconductor structure. The conductive material has a work function $E_C$, the absolute value of which is equal to or higher than the absolute value of $E_H$ diminished by 1.5 eV. The absolute value of the work function $E_C$ does not exceed the absolute value of $E_H$ diminished by 0.4 eV. Therefore, the absolute value of the work function $E_C$ is less than the absolute value of $E_H$. In particular, the absolute value of the work function $E_C$ differs from the absolute value of $E_H$ by at least 0.4 eV. Further, the absolute value of the work function $E_C$ does not differ from the absolute value of $E_H$ by more than 1.5 eV.

In a preferred embodiment, the organic semiconductor material has a bulk concentration of positive charge carrier equivalents $N_p$ with $N_p \leq 1 \times 10^{16}$ cm$^{-3}$, $N_p \leq 8 \times 10^{15}$ cm$^{-3}$, $N_p \leq 6 \times 10^{15}$ cm$^{-3}$, $N_p \leq 5 \times 10^{15}$ cm$^{-3}$, $N_p \leq 10^{16}$ cm$^{-3}$, $N_p \leq 4 \times 10^{15}$ cm$^{-3}$, $N_p \leq 2 \times 10^{15}$ cm$^{-3}$, or $N_p \leq 1 \times 10^{15}$ cm$^{-3}$. Positive charge carrier equivalents are positive charge distributions within the organic semiconductor material which have the electrical effect of free positive charge carriers, for example holes. A positive charge carrier equivalent corresponds to a charge unit if the electrostatic effect of the positive charge carrier equivalent corresponds to the electrostatic effect of a positive free charge carrier being charged with one charge unit.

Different bulk concentrations within an organic semiconductor material can be provided by distinct physical structures of the organic semiconductor material due to the dependency of the bulk concentration of charge carrier equivalents within the organic semiconductor material on its structure. In particular, this applies to organic semiconductor material which is deposited as a solution, wherein at least one of the concentration of the solution, the kind of solvent, the process temperature, a mechanical pressure exerted on the semiconductor material, e.g. a centrifugal force, the process duration and the time elapsed since the preparation of the solution defines the charge carrier equivalents.

According to a more preferred embodiment, the semiconductor structure is adapted to provide a depletion width $l_d$ of at least 100 nm, preferably of at least 125 nm, and most preferably of at least 250 nm within the semiconductor region. The depletion width applies to a condition, in which no external voltage is applied to the conductor region. Further, the semiconductor structure is adapted to provide a depletion width $l_d$ of at least 75 nm, at least 100 nm, at least 150 nm, at least 200 nm, at least 300 nm, at least 400 nm, at least 500 nm, at least 600 nm, at least 700 nm, at least 800 nm, at least 900 nm, or at least 1 µm. The depletion width can be provided or adapted by at least one of the energy level $E_H$ of the highest occupied molecular orbital of the at least one organic semiconductor material, the work function $E_C$ of the conductive material and the bulk concentration of positive charge carrier equivalents $N_p$ at an appropriate level. The depletion width is the width of the depletion zone at the condition that no external voltage is applied to the conductor region.

As far as the materials of the semiconductor regions are concerned, no specific restrictions exist provided that above-described embodiments of the present invention can be realized.

According to a preferred embodiment, at least one of the semiconductor regions of the inventive semiconductor structure contains at least one suitable diketopyrrolopyrrole (DPP) polymer as semiconductor material. Preferably, at least one of the semiconductor regions comprises, as semiconductor material, at least one suitable DPP polymer. More preferably, each of the at least one of the semiconductor regions comprises, as semiconducting material, at least one suitable DPP polymer wherein the at least one DPP polymer comprised in a given semiconductor region is the same as or different from the at least one DPP polymer in another semiconductor region.

Generally, a DPP polymer of the present invention is a polymer having one or more DPP skeletons represented by the following formula in the repeating unit. Examples of DPP polymers and their synthesis are, for example, described in U.S. Pat. No. 6,451,459B1, WO05/049695, WO2008/000664, WO2010/049321, WO2010/049323, WO2010/108873, WO2010/115767, WO2010/136353, PCT/EP2011/060283 and WO2010/136352.

According to a preferred embodiment, the at least one organic semiconductor material comprises a diketopyrrolopyrrole (DPP) polymer having one or more DPP skeletons represented by the following formula in the repeating unit,
wherein $R^1$ and $R^2$ are the same or different from each other and are selected from the group consisting of hydrogen; a $C_1$-$C_{100}$ alkyl group; —COOR$^{106}$; a $C_1$-$C_{100}$ alkyl group which is substituted by one or more halogen atoms, hydroxyl groups, nitro groups, —CN, or $C_6$-$C_{18}$ aryl groups and/or interrupted by —O—, —COO—, —OCO—, or —S—; a $C_7$-$C_{100}$ arylalkyl group; a carbamoyl group; a $C_5$-$C_{12}$ cycloalkyl group which can be substituted one to three times with a $C_1$-$C_8$ alkyl group and/or a $C_1$-$C_8$ alkoxy group; a $C_6$-$C_{24}$ aryl group, in particular phenyl or 1- or 2-naphthyl which can be substituted one to three times with a $C_1$-$C_8$ alkyl group, a $C_1$-$C_{25}$ thioalkoxy group, and/or a $C_1$-$C_{26}$ alkoxy group; and pentafluorophenyl;
with $R^{106}$ being a $C_1$-$C_{50}$ alkyl group, preferably a $C_4$-$C_{25}$ alkyl group.

Still more preferably, the DPP polymer comprised in the at least one semiconductor region of the semiconductor structure of the present invention is selected from a group consisting of a polymer of formula (Ia)

$$*{-}\!\!\left[\!A\!\right]\!\!_n{-}*\tag{Ia}$$

a copolymer of formula (Ib)

$$*{-}\!\!\left[\!A\!-\!D\!\right]\!\!_n{-}*\tag{Ib}$$

a copolymer of formula (Ic)

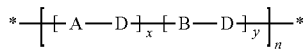

and a copolymer of formula (Id),

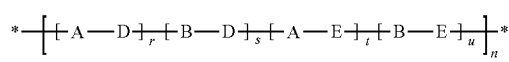

wherein x=0.995 to 0.005, y=0.005 to 0.995, preferably x=0.2 to 0.8, y=0.8 to 0.2, with the proviso that x+y=1; r=0.985 to 0.005, s=0.005 to 0.985, t=0.005 to 0.985, u=0.005 to 0.985, with the proviso that r+s+t+u=1; n=4 to 1000, preferably 4 to 200, more preferably 5 to 100, A is a group of formula

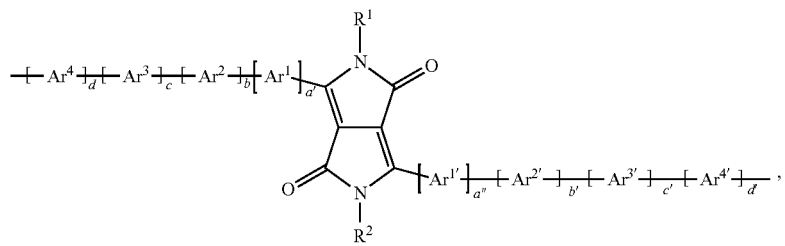

wherein a'=1, 2, or 3; a''=0, 1, 2, or 3; b=0, 1, 2, or 3; b'=0, 1, 2, or 3; c=0, 1, 2, or 3; c'=0, 1, 2, or 3; d=0, 1, 2, or 3; d'=0, 1, 2, or 3; with the proviso that b' is not 0 if a'' is 0; $Ar^1$, $Ar^{1'}$, $Ar^2$, $Ar^{2'}$, $Ar^3$, $Ar^{3'}$, $Ar^4$ and $Ar^{4'}$ are independently of each other heteroaromatic or aromatic rings, which optionally can be condensed and/or substituted, preferably

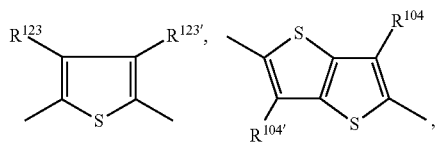

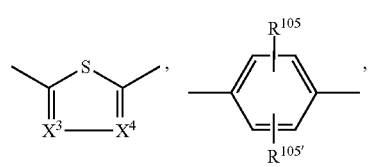

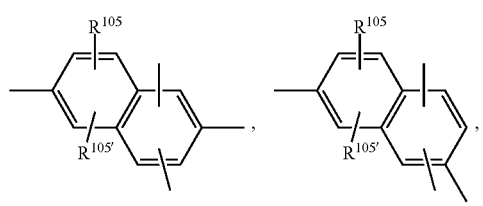

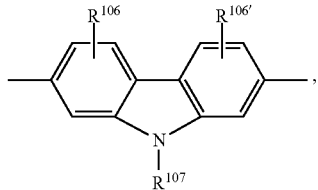

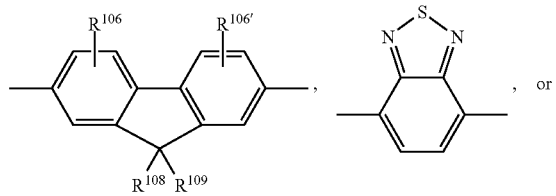

(X)

-continued

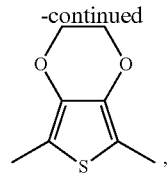

wherein one of $X^3$ and $X^4$ is N and the other is $CR^{99}$;

$R^{99}$, $R^{104}$, $R^{104'}$, $R^{123}$ and $R^{123'}$ are independently of each other hydrogen, halogen, especially F, or a $C_1$-$C_{25}$ alkyl group, especially a $C_4$-$C_{25}$ alkyl, which may optionally be interrupted by one or more oxygen or sulphur atoms, $C_7$-$C_{25}$ arylalkyl, or a $C_1$-$C_{25}$ alkoxy group;

$R^{105}$, $R^{105'}$, $R^{106}$ and $R^{106'}$ are independently of each other hydrogen, halogen, $C_1$-$C_{25}$ alkyl, which may optionally be interrupted by one or more oxygen or sulphur atoms; $C_7$-$C_{25}$ arylalkyl, or $C_1$-$C_{18}$, alkoxy;

$R^{107}$ is $C_7$-$C_{25}$ arylalkyl, $C_6$-$C_{18}$ aryl; $C_6$-$C_{18}$ aryl which is substituted by $C_1$-$C_{18}$ alkyl, $C_1$-$C_{18}$ perfluoroalkyl, or $C_1$-$C_{18}$ alkoxy; $C_1$-$C_{18}$ alkyl; $C_1$-$C_{18}$ alkyl which is interrupted by —O—, or —S—; or —$COOR^{124}$;

$R^{124}$ is $C_1$-$C_{25}$ alkyl group, especially a $C_4$-$C_{25}$ alkyl, which may optionally be interrupted by one or more oxygen or sulphur atoms, $C_7$-$C_{25}$ arylalkyl;

$R^{108}$ and $R^{109}$ are independently of each other H, $C_1$-$C_{25}$ alkyl, $C_1$-$C_{25}$ alkyl which is substituted by E and/or interrupted by D, $C_7$-$C_{25}$ arylalkyl, $C_6$-$C_{24}$ aryl, $C_6$-$C_{24}$ aryl which is substituted by G, $C_2$-$C_{20}$ heteroaryl, $C_2$-$C_{20}$ heteroaryl which is substituted by G, $C_2$-$C_{18}$ alkenyl, $C_2$-$C_{18}$ alkynyl, alkoxy, alkoxy which is substituted by E and/or interrupted by D, or $C_7$-$C_{25}$ aralkyl; or $R^{108}$ and $R^{109}$ together form a group of formula =$CR^{110}R^{111}$, wherein
$R^{110}$ and $R^{111}$ are independently of each other H, $C_1$-$C_{18}$ alkyl, $C_1$-$C_{18}$ alkyl which is substituted by E and/or interrupted by D, $C_6$-$C_{24}$ aryl, $C_6$-$C_{24}$ aryl which is substituted by G, or $C_2$-$C_{20}$ heteroaryl, or $C_2$-$C_{20}$ heteroaryl which is substituted by G; or
$R^{108}$ and $R^{109}$ together form a five or six-membered ring, which optionally can be substituted by $C_1$-$C_{18}$ alkyl, $C_1$-$C_{18}$alkyl which is substituted by E and/or interrupted by D, $C_6$-$C_{24}$ aryl, $C_6$-$C_{24}$ aryl which is substituted by G, $C_2$-$C_{20}$ heteroaryl, $C_2$-$C_{20}$ heteroaryl which is substituted by G, $C_2$-$C_{18}$ alkenyl, $C_2$-$C_{18}$ alkynyl, $C_1$-$C_{18}$ alkoxy, alkoxy which is substituted by E and/or interrupted by D, or $C_7$-$C_{25}$ aralkyl;
D is —CO—, —COO—, —S—, —O—, or —$NR^{112}$—;
E is $C_1$-$C_8$ thioalkoxy, $C_1$-$C_8$ alkoxy, CN, —$NR^{112}R^{113}$, —$CONR^{112}R^{113}$, or halogen,
G is E, or $C_1$-$C_{18}$ alkyl, and
$R^{112}$ and $R^{113}$ are independently of each other H; $C_6$-$C_{18}$ aryl; $C_6$-$C_{18}$ aryl which is substituted by $C_1$-$C_{18}$ alkyl, or $C_1$-$C_{18}$ alkoxy; $C_1$-$C_{18}$ alkyl; or $C_1$-$C_{18}$ alkyl which is interrupted by —O— and B, D and E are independently of each other a group of formula

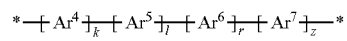

or formula (X), with the proviso that in case B, D and E are a group of formula (X), they are different from A, wherein k=1; l=0 or 1; r=0 or 1; z=0 or 1; and
$Ar^4$, $Ar^5$, $Ar^6$ and $Ar^7$ are independently of each other a group of formula

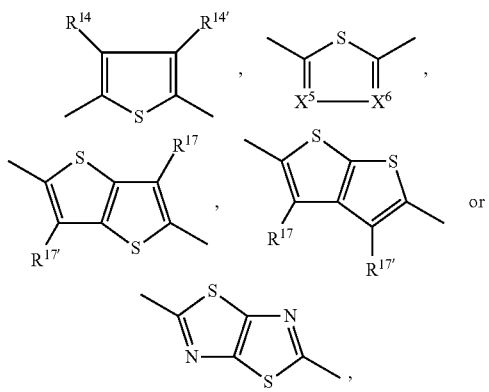

wherein one of $X^5$ and $X^6$ is N and the other is $CR^{14}$,
c is an integer of 1, 2, or 3,
d is an integer of 1, 2, or 3,
$Ar^8$ and $Ar^{8'}$ are independently of each other a group of formula

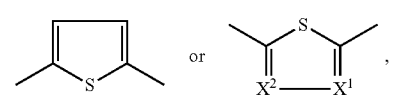

$X^1$ and $X^2$ are as defined above,
$R^{1''}$ and $R^{2''}$ may be the same or different and are selected from hydrogen, a $C_1$-$C_{36}$ alkyl group, especially a $C_6$-$C_{24}$ alkyl group, a $C_6$-$C_{24}$ aryl, in particular phenyl or 1- or 2-naphthyl which can be substituted one to three times with $C_1$-$C_8$ alkyl, $C_1$-$C_8$ thioalkoxy, and/or $C_1$-$C_8$ alkoxy, or pentafluorophenyl,
$R^{14}$, $R^{14'}$, $R^{17}$ and $R^{17'}$ are independently of each other H, or a $C_1$-$C_{25}$ alkyl group, especially a $C_6$-$C_{25}$ alkyl, which may optionally be interrupted by one or more oxygen atoms.
$Ar^1$ and $Ar^{1'}$ are preferably

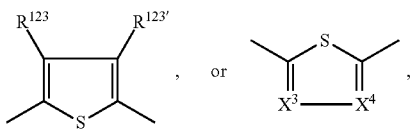

more preferably

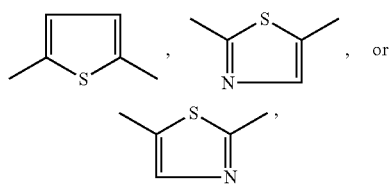

wherein

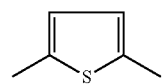

is most preferred.
$Ar^2$, $Ar^{2'}$, $Ar^3$, $Ar^{3'}$, $Ar^4$ and $Ar^{4'}$ are preferably

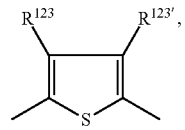

more preferably

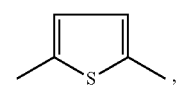

The group of formula

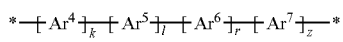

is preferably

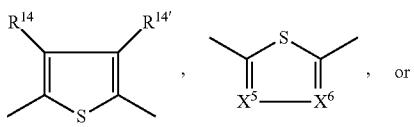

-continued
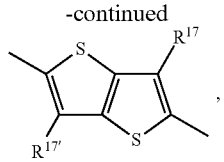
more preferably
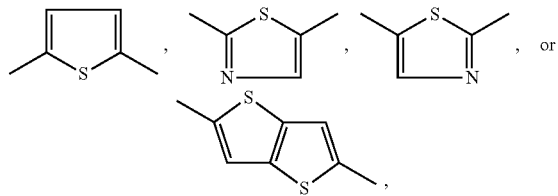
most preferred
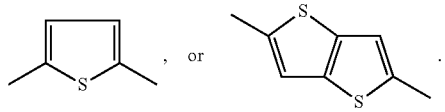
$R^1$ and $R^2$ may be the same or different and are preferably selected from hydrogen, a $C_1$-$C_{100}$alkyl group, especially a $C_8$-$C_{36}$alkyl group.
The group A is preferably selected from
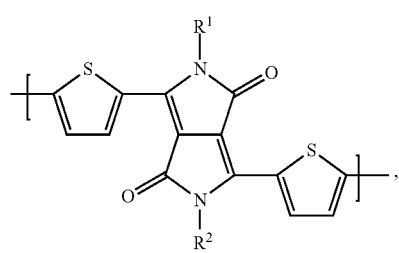
The group of formula
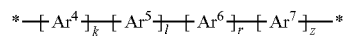
is preferably a group of formula
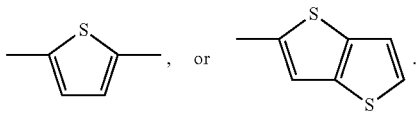
Examples of preferred DPP polymers of formula Ia are, for example:
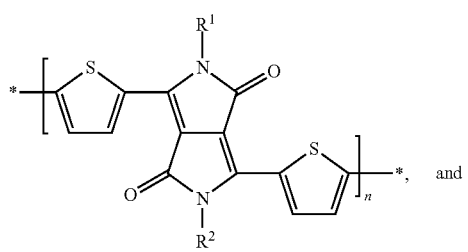
(Ia-1)
(Xa)
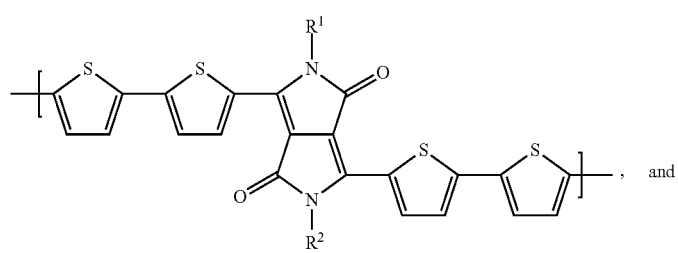, and
(Xb)
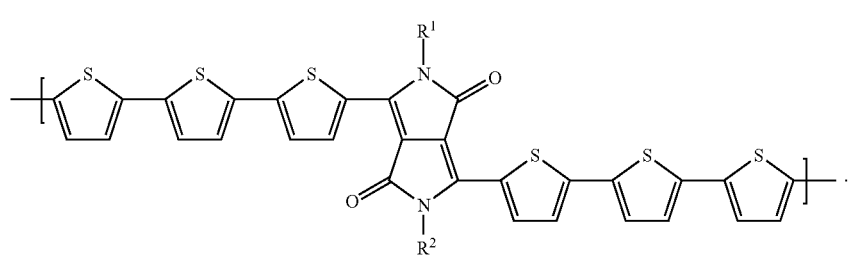.
(Xc)

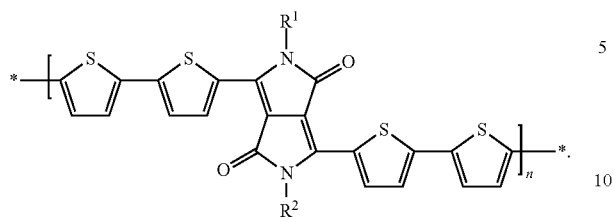
(Ia-2)
Examples of preferred DPP polymers of formula Ib are, for example:
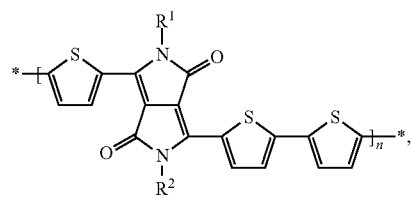
(Ib-1)
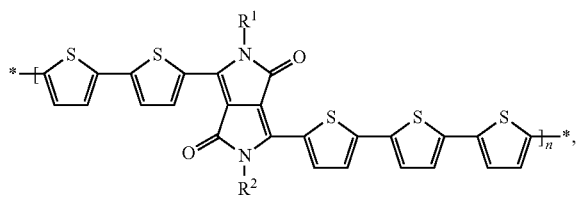
(Ib-2)
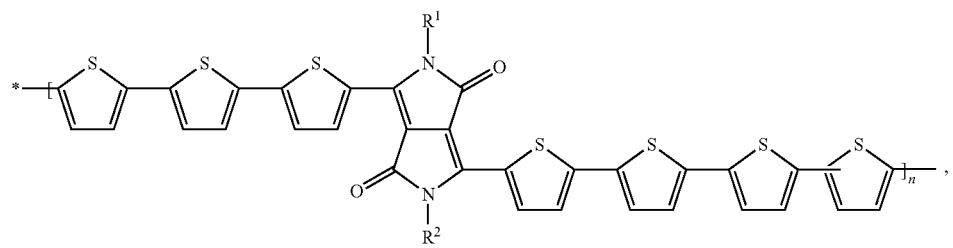
(Ib-3)
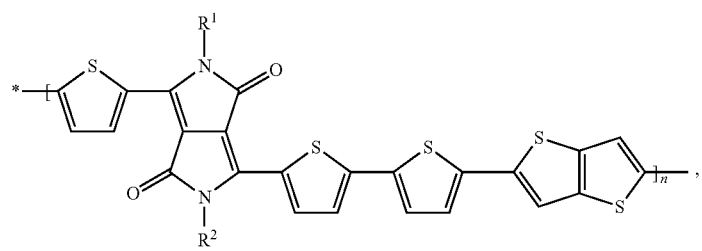
(Ib-4)
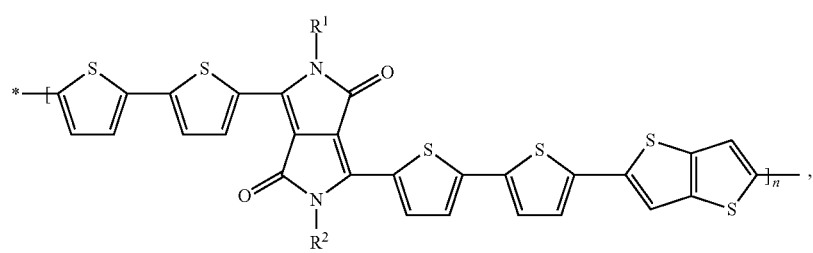
(Ib-5)
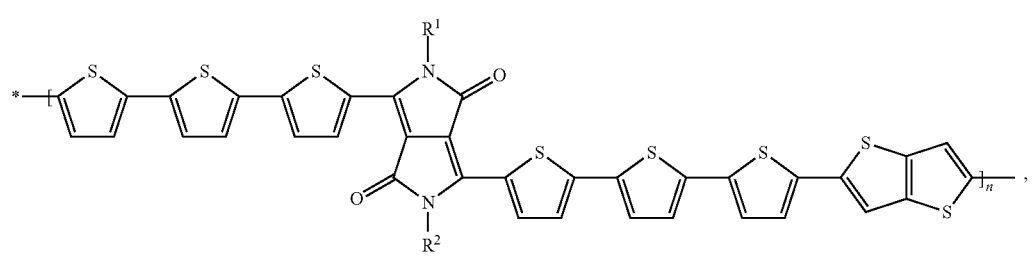
(Ib-6)

-continued

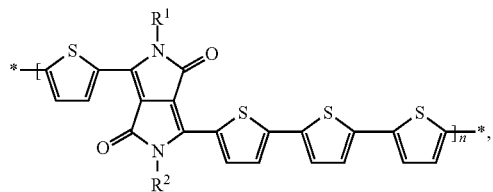
(Ib-7)

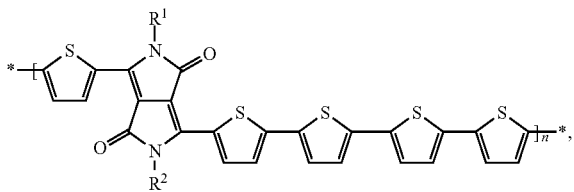
(Ib-8)

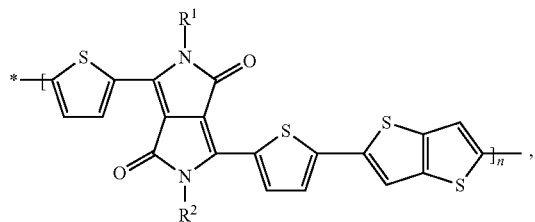
(Ib-9)

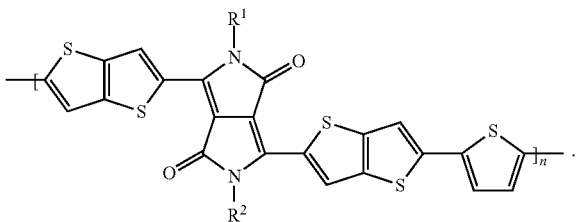
(Ib-10)

Examples of preferred DPP polymers of formula Ic are, for example:

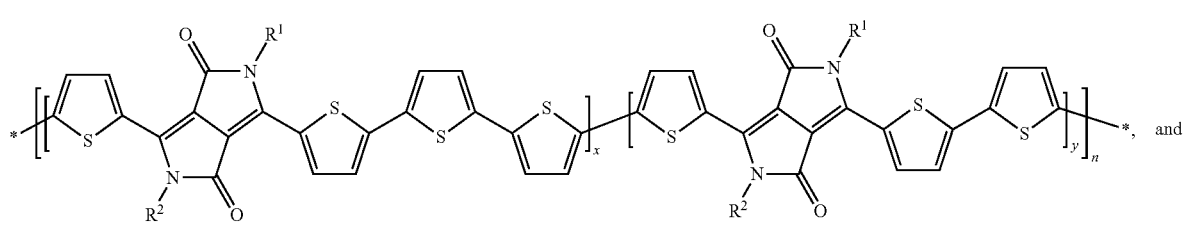
(Ic-1)

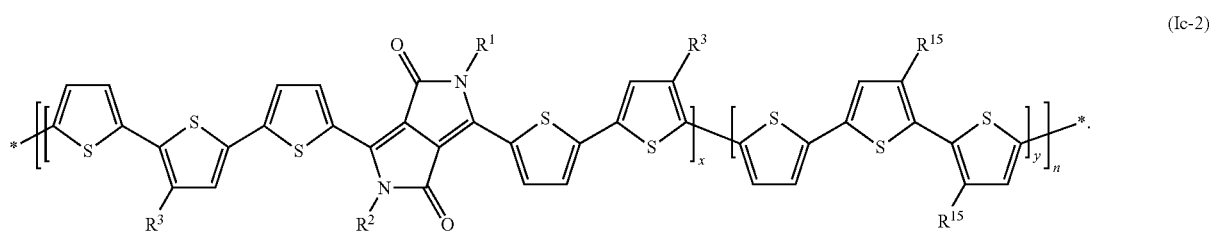
(Ic-2)

In particular in above-described preferred DPP polymers of structures (Ia), (Ib), and (Ic), the groups $R^1$ and $R^2$ are, independently from each other, a $C_1$-$C_{36}$alkyl group, especially a $C_8$-$C_{36}$alkyl group. n is preferably 4 to 1000, especially 4 to 200, very especially 5 to 100. $R^3$ is preferably a $C_1$-$C_{18}$alkyl group. $R^{15}$ is preferably a $C_4$-$C_{18}$alkyl group. As far as the indices are concerned, x is preferably in the range from 0.995 to 0.005, and y is preferably in the range from 0.005 to 0.995. More preferably, x=0.4 to 0.9, and y=0.6 to 0.1, with x+y=1.

According to an especially preferred embodiment of the present invention, the at least one DPP polymer comprised in the at least one semiconductor region is a DPP polymer of structure (Ib), even more preferably of structure (Ib-1), (Ib-9), (Ib-10). Therefore, the present invention relates to above-described semiconductor structure, wherein the DPP polymer is, for example, a polymer according to formula (Ib-1)

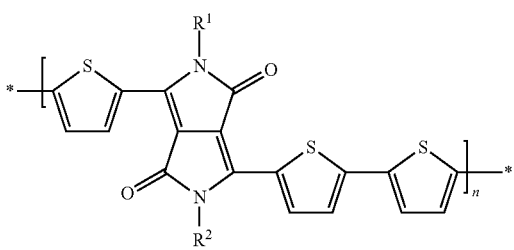
(Ib-1)

wherein $R^1$ and $R^2$ are independently from each other a $C_8$-$C_{36}$ alkyl group, with n=4 to 1000, preferably 4 to 200, more preferably 5 to 100. One especially preferred DPP polymer according to structure (Ib-1) is, for example,

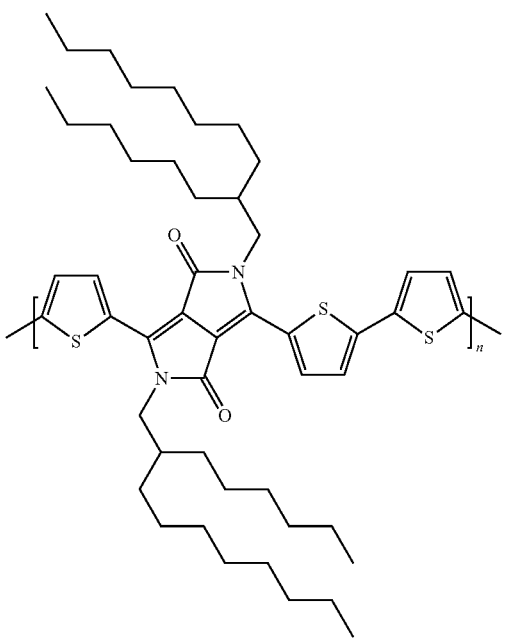

with Mw=39,500, and a polydispersity=2.2 (measured by HT-GPC)). Reference is made, for example, to Example 1 of WO2010/049321.

Halogen is fluoro, chloro, bromo, iodo, especially fluoro.

$C_1$-$C_{25}$alkyl ($C_1$-$C_{18}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_1$-$C_{25}$alkoxy ($C_1$-$C_{18}$alkoxy) groups are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_2$-$C_{25}$alkenyl ($C_2$-$C_{18}$alkenyl) groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_{2-24}$alkynyl ($C_{2-18}$alkynyl) is straight-chain or branched and preferably $C_{2-8}$alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_5$-$C_{12}$cycloalkyl is typically cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are:

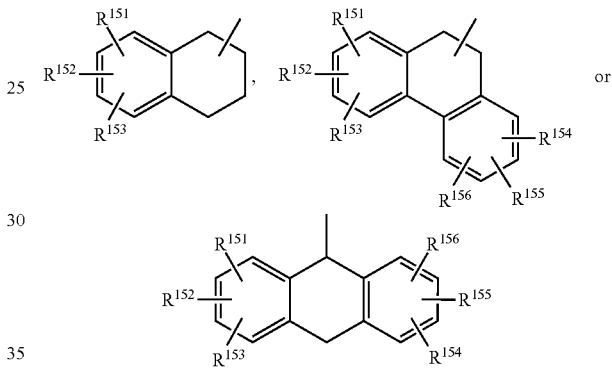

in particular

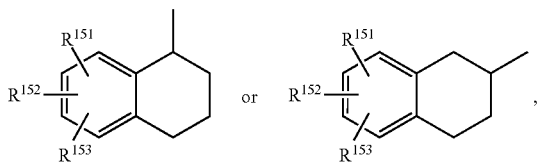

wherein $R^{151}$, $R^{152}$, $R^{153}$, $R^{154}$, $R^{155}$ and $R^{156}$ are independently of each other $C_1$-$C_8$-alkyl, $C_1$-$C_8$-alkoxy, halogen and cyano, in particular hydrogen.

$C_6$-$C_{24}$aryl ($C_6$-$C_{18}$aryl) is typically phenyl, indenyl, azulenyl, naphthyl, biphenyl, as-indacenyl, s-indacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of $C_6$-$C_{12}$aryl are phenyl, 1-naphthyl, 2-naphthyl, 3- or 4-biphenyl, 2- or 9-fluorenyl or 9-phenanthryl, which may be unsubstituted or substituted.

$C_7$-$C_{25}$aralkyl is typically benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted. Preferred examples are benzyl, 2-phenylethyl, 3-phenylpropyl, naphthylethyl, naphthylmethyl, and cumyl.

The term "carbamoyl group" typically stands for a $C_{1-18}$carbamoyl radical, preferably $C_{1-8}$carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

Heteroaryl is typically $C_2$-$C_{26}$heteroaryl ($C_2$-$C_{20}$heteroaryl), i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, a carbamoyl group, a nitro group or a silyl group, especially $C_1$-$C_8$alkyl, $C_1$-$C_8$alkoxy, $C_1$-$C_8$alkylthio, halogen, halo-$C_1$-$C_8$alkyl, or a cyano group.

If, according to a conceivable embodiment, the inventive semiconductor structure has two semiconductor regions which are partly separated by the one conductor regions, it is preferred that each of the two semiconductor regions comprises at least one DPP polymer of structure (Ib), more preferably at least one DPP polymer of structure (Ib-1), even more preferably at least one DPP polymer of structure (Ib-1) wherein $R^1$ and $R^2$ are independently from each other a $C_8$-$C_{36}$ alkyl group, with n=4 to 1000, preferably 4 to 200, more preferably 5 to 100. According to an even more preferred embodiment of the present invention, both semiconductor regions contain the same DPP polymers, even more preferably exactly one DPP polymer.

In particular, the polydispersity of the polymer comprised by the at least one organic semiconductor material, preferably the at least one DPP polymer, has a polydispersity in the range of from 1.01 to 10, preferably from 1.1 to 3.0 and more preferably from 1.5 to 2.5.

The openings within the at least one conductor region have an inner width of at least 200 nm, preferably at least 250 nm and most preferably at least 500 nm. Further, the inner width of the openings can be at least 150 nm, at least 200 nm, at least 300 nm, at least 400 nm, at least 600 nm, at least 800 nm, at least 1000 nm, at least 1200 nm, at least 1400 nm, at least 1600 nm, at least 1800 nm, or at least 2 µm. A variety of simple approaches can be used for providing such openings. In particular due to the large inner size of the openings, the openings can be easily provided with mechanical methods. Particular method steps for providing such openings are given below in the context of the inventive method. The openings have a substantially circular inner cross section.

According to an embodiment of the present invention, the openings within the at least one conductor region are embossed openings, mechanically cut openings or laser-cut openings. In particular, the openings can be embossed openings, which are formed by pressing into a layer of conductive material. A patterned matrix can be used, which is pressed into the conductive layer such that the resulting openings are formed by mechanical removal of the conductive material. Thus, the openings can be formed by the formation using a patterned matrix. Further, the openings can be formed by cutting, wherein two cutting matrices are used which are pressed into a layer of the conductive material from both sides of the layer thereby cutting conductive material from the location of the openings. In particular, such matrices used for providing the openings can have the shape of rollers. In case that embossed openings are provided, the layer of conducting material can be an individual layer or a layer supported by a substrate, e.g. supported by a semiconductor region. Further, the openings can be laser-cut openings formed by evaporation of conducting material within a layer at the locations of the openings. In the case of laser-cut openings, the openings can be formed within an individual layer of conductive material forming the conductor region or can be formed by a layer supported by substrate, e.g. by a semiconductor region. The conductor region comprising the openings can be provided by a foil, a sheet or a deposited layer of conductive material.

The conductive material of the conductor region comprises or preferably consists of a metal, of an alloy or of a conductive polymer, preferably a metal, more preferably a metal selected from the group consisting of Al, Cr, Cu, Fe, In, Sb, Si, Sn, and Zn, wherein the metal is in particular Al. The alloy is preferably an alloy comprising at least two of these metals. The conductive material can be provided as a homogenous structure of the metal, the alloy or the conductive polymer, or can be a compound comprising at least two of the metal, the alloy or the conductive polymer. In a particular embodiment, the conductive material is provided by nanotubes, which can be provided within a matrix of the metal, the alloy or the conductive polymer. In another embodiment, the conductive material is provided by a semiconducting material, which is highly doped. Since highly doped semiconductor materials provide high electrical conductivity, such highly doped semiconductor materials are regarded as conductive materials in the sense of the invention as far as they exhibit a specific electrical resistance of the conductor material. In addition, instead of the metal or the alloy, an electrically conducting compound thereof can be used. In particular, indium tin oxide can be used as conductive material. In particular, the highly doped semiconductor material is a semiconductor material doped with a p-dopant or, preferably, an n-dopant at a high concentration leading to high electrical conductivity. The conductive material and in particular the highly doped semiconductor material has a specific electrical resistivity of less than $1 \times 10^2$, less than $1 \times 10^1$, or less than 1 Ωm.

The present invention thus includes a semiconductor structure comprising at least one conductor region and at least two semiconductor regions, which semiconductor regions are partly separated by the at least one conductor region, wherein the at least one conductor region comprises openings extending between the semiconductor regions which are partly separated by the respective conductor region, wherein the semiconductor regions comprise at least one organic semiconductor material selected from DPP polymers described above, and wherein the conductor region comprises a metal selected from the group consisting of Al, Cr, Cu, Fe, In, Sb, Si, Sn, and Zn, the metal in particular being Al.

An embodiment of the inventive semiconductor structure comprises at least two electrodes at end faces of the semiconductor regions, preferably one electrode at each of both end faces of the semiconductor regions. The electrodes as well as the conductor region each comprise a contact region or are provided with a conductor adapted for external contact. The electrodes are provided at faces of the semiconductor region, which are not covered by a conductor region. Preferably, all conductor regions are located between two semiconductor regions and, consequently, are located between two electrodes. The electrodes coextend with the semiconductor regions and the at least one conductor region. Electrodes are provided by conductive material, preferably by a conductive material having a work function $E_E$ with $|E_E| \geq |E_H| - 0.3$ eV. Further, the absolute value of the work function $E_E$ of the electrode material is preferably less than or equal to $|E_H| + 0.9$ eV. The electrodes are an integral layer, which is preferably continuous. As an example, the electrodes substantially consist of Au or Ag. However, also other conducting materials can be used, e.g. indium tin oxide or zinc oxide or a material comprises at least one conducting polymer. If the conductor is provided for external contact, the conductor at least partly extends laterally to the electrode. In addition, each of the electrodes can have a multi-layered substructure, wherein the electrode material having a work function of $E_E$ is provided by a coating of the substructure abutting to the semiconductor region or semiconductor regions, and wherein this coating is provided on an electrically conductive substrate with the work function of $E_E$. The semiconductor regions which are partly separated by the respective conductor region are in direct contact with each other through the openings of said conductor region. The semiconductor regions are separated by the respective conductor region by sections of the respective conductor region lateral to the openings. The semiconductor regions are separated by the material of the conductor region within the sections lateral to the openings. These sections are provided for applying an electrical field to at least one of the semiconductor regions. The semiconductor regions on both sides of the respective conductor region are physically connected to each other via the openings. Preferably, semiconductor material extending through openings forms a continuous inner opening section. The semiconductor regions are on both sides of the respective conductor region and are continuously and physically connected with each other, preferably via the inner opening section of the semiconductor material. In this way, the inventive semiconductor structure is adapted to provide transfer of free charge carriers between semiconductor regions partly separated by the conductor region.

The inventive semiconductor structure comprises or, preferably, substantially consists of a conductor region partly separating two semiconductor regions. The conductor region and the two semiconductor regions provide a vertical transistor structure, wherein the conductor region provides a gate, a basis or a grid adapted for conductivity control between the semiconductor regions. A particular embodiment of such a semiconductor structure comprises one conductor region separating two semiconductor regions, as well as two electrodes. The end faces of each of the semiconductor regions opposite to the conductor region each carry one of the electrodes. The resulting vertical transistor structure is adapted to controllably provide current between the electrodes, wherein the current is controlled by a voltage or a current between the gate, i.e. the conductor region on one side and one of the electrodes on the other side. In such a structure, preferably each of the two semiconductor regions comprises the same organic semiconductor material, preferably the same DPP polymer. In particular, each of the two semiconductor regions consists of the same organic semiconductor material, preferably the same DPP polymer.

The organic semiconductor material of at least one of the semiconductor regions is most preferably a cast material, in particular a spin-cast material, coated material or printed material. A cast material is provided by a solution of the organic semiconductor material within at least one solvent, and by removing such a solvent, e.g. by evaporation. The electrical properties of the semiconductor material can be set by a microstructure of the organic semiconductor material, wherein the microstructure is mainly defined by the deposition method of the cast material. Further, the material can be printed in form of dissolved semiconductor material. In particular, the semiconductor material can be inkjet-printed material. Inkjet-printed material can be provided in a desired pattern in order to pattern the semiconductor structure in a direction along which the semiconductor structure extends.

According to a further aspect of the invention, a method for producing an inventive semiconductor structure is provided. The method comprises the following steps:
(a) providing at least two semiconductor regions comprising at least one organic semiconductor material;
(b) providing at least one conductor region between the at least two semiconductor regions;
(c) providing openings in the at least one conductor region extending through the entire conductor region; and
(d) partly contacting the at least two semiconductor regions through the openings of the at least one conductor region.

In a preferred method, step (b) comprises providing the at least one conductor region as a continuous layer of the conductive material and step (c) comprises embossing, mechanically cutting or laser cutting the openings with an inner width of the openings of more than 200 nm, preferably more than 250 nm, more preferably more than 500 nm, through the continuous layer. In this preferred method step (b), at least one of the conductor regions usually is provided as an individual continuous sheet, and step (c) is carried out before (b) is completed and before, during or after the conductor region is joined with one of the at least two semiconductor regions. The individual continuous sheet preferably is a prefabricated sheet.

Alternatively, said preferred method may be carried out in that in step (b), at least one of the conductor regions is deposited onto one of the at least two semiconductor regions provided in (a), preferably by vapor deposition, and step (c) is carried out before (b) is completed and during or after the conductor region is deposited.

Also preferred is a method, wherein, for each of the semiconductor regions, (a) comprises applying the organic semiconductor material onto a substrate or onto the at least one conductor region in one or more steps, wherein the organic semiconductor material is applied in free-flowing form as a solution, suspension, or emulsion comprising the organic semiconductor material, preferably by casting, spraying or printing, or wherein the organic semiconductor material is applied in solid form, and wherein (d) comprises applying the organic semiconductor material of at least one of these semiconductor regions into the openings, in particular by casting, and preferably in the course of (a). According to this method, the organic semiconductor material often is provided as a solution or dispersion of the material in at least one organic solvent, the solution preferably having a content of 0.5 to 20 weight-% of the organic semiconductor material, relative to the total weight of the solution or dispersion. The solution or dispersion may be spin cast on the substrate.

In a preferred method, the above process is carried out performing the following steps:
(i) providing at least one semiconductor region comprising at least one organic semiconductor material;
(ii) providing at least one conductor region in contact to the semiconductor region;
(iii) providing openings in the at least one conductor region extending through the entire conductor region;
(iv) providing at least one semiconductor region comprising at least one organic semiconductor material in contact with the conductor region in way that conductor region is between at least two semiconductor regions; and
(v) partly contacting the at least two semiconductor regions 5 through the openings of the at least one conductor region.

One embodiment of steps (ii) and (iii) of said method is applying a conductor having pre-formed openings (ii), another embodiment thereof comprises the forming the openings after applying to the 1st semiconductor (iii), i.e.
(a) providing at least one conductor region with openings in the at least one conductor region extending through the entire conductor region in contact to the semiconductor region; or
(b) providing at least one conductor region in contact to the semiconductor region, and subsequently providing openings in the at least one conductor region extending through the entire conductor region.

When the 2nd semiconductor region is provided (step iv), contact with the 1st semiconductor layer through openings (step v) may be formed as a separate step or preferably immediately.

Furthermore preferred is a method, wherein at least two electrodes are applied to end faces of the semiconductor regions by depositing an electrode material onto at least one of the end faces, or by providing the electrode material, onto which at least one of the semiconductor regions is applied, wherein the electrode material is preferably Au, Ag, Pt, Pd or an alloy of at least two of these materials.

The organic semiconductor material of step (a) has a HOMO (highest occupied molecular orbital) energy level $E_H$, $E_H$ being defined by 5.0 eV$\leq$$|E_H|$$\leq$5.8 eV. The at least one conductor region provided in step (b) comprises a conductive material having a work function $E_C$ being defined by $|E_H|$−1.5 eV$\leq$$|E_C|$$\leq$$|E_H|$−0.4 eV.

Alternatives for the range of the energy level $E_H$ are: 5.1 eV$\leq$$|E_H|$$\leq$5.8 eV, 5.0 eV$\leq$$|E_H|$+$\leq$5.7 eV or preferably 5.1 eV$\leq$$|E_H|$$\leq$5.7 eV.

HOMO/LUMO values are obtained experimentally using cyclic voltammetry (Autolab PGSTAT30® Potentiostat), using Pt working electrode, Ag counter electrode and AgCl coated Ag as pseudo-reference electrode; electrolyte is 0.1M tetrabutylammonium hexafluorophosphate in o-dichlorobenzene; internal reference is ferrocene.

In particular, the semiconductor regions, the organic semiconductor material, the at least one conductor region and/or the conductive material are provided according to the definitions provided above with regard to the inventive semiconductor structure.

Preferably, step (b) comprises providing at least one conductor region as a continuous layer of the conductive material. Further, step (c) comprises embossing, mechanically cutting or laser-cutting the openings with an inner width of the openings of more than 200 nm, preferably more than 250 nm, more preferably more than 500 nm, through the continuous layer. In particular, the openings provided by step (c) are provided with an inner width of at least 150 nm, 200 nm, 300 nm, 400 nm or 600 nm. In addition, the inner width can be at least 800 nm, at least 1000 nm, at least 1200 nm, at least 1400 nm, at least 1600 nm, at least 1800 nm or at least 2 µm. The conductor region can be coated and the openings can be provided after having applied the continuous layer as a coating. Alternatively, the conductor region can be applied by patterning such that the openings are formed when the conductor region is provided.

The conductor region can be provided by coating or patterning the conductive material, in particular by coating or patterning the conductive material dissolved in a solvent. The conductive material can be spray-coated, printed, in particular inkjet-printed, deposited, e.g. by chemical vapor deposition, or by other suitable coating or patterning methods. Generally, subtractive or additive methods for providing the conductor region can be used. In particular, these methods are role-to-role techniques. The additive methods include deposition, in particular by evaporation, sputtering, coating or printing of the conductive material. The pattern is formed by removal or modification of the conductive material. In particular, removal includes lithographical methods combined with etching, lift-off, delamination or laser ablation/laser cutting of the conductive material. Modification includes embossing, oxidation, light exposure or chemical treatment of the conductive material. The subtractive methods include printing, e.g. gravure, screen printing, flexo printing or µ-contact printing. Further, the subtractive methods include the application of the shadow mask before adding the conductive material, wherein the conductive material is added by evaporation or sputtering. In addition, the subtractive methods include transfer of conductive material, in particular by stamping, by lamination or by thermal transfer.

These methods can also be used to provide electrodes at end faces of the semiconducting material, wherein electrode material takes the place of the conductive material.

Advantageously, at least one of the conductor regions is provided as an individual continuous sheet. Further, step (c) of providing the openings is carried out before step (b) of providing the at least one conductive region is completed. The openings can be provided in the at least one conductor region by using an individual continuous sheet, perforating this individual continuous sheet by embossing, mechanically cutting or laser-cutting and by applying the perforated continuous sheet onto the semiconductor region, in particular by lamination. Further, the openings can be provided by joining the continuous sheet with one of the semiconductor regions as one step, e.g. by rolling the continuous sheet onto the semiconductor region using a roller comprising an outer structure adapted for pressing or cutting the openings into the sheet. Therefore, the roller presses the sheet onto the semiconductor region in order to join the conductor region and the semiconductor region and, at the same time, embosses or cuts the openings into the sheet. Further, the openings can be provided after the conductor region is joined with the semiconductor region by laser-cutting, by mechanically cutting or by embossing. In this way, the conductor region is joined with the semiconductor region as a first step, e.g. by lamination or by vapor deposition, and, as a subsequent second step, openings are cut or embossed into the sheet, which is already joined with the semiconductor region. Preferably, embossing is provided by nano imprinting using stamps having a structure complementary to the structure of the openings.

In an exemplifying embodiment, the individual continuous sheet is a prefabricated sheet. The individual continuous sheet is already provided with all structural features before joining the sheet with the semiconductor region. The prefabricated sheet and the conductor region within the semiconductor structure provide the same structural features including the openings.

In another embodiment, the at least one conductor region is deposited onto one of the at least two semiconductor regions provided in step (a). The at least one conductor region is preferably deposited by vapor deposition. Step (c) of providing the openings is carried out before step (b) of providing the at least one conductor region is completed and during or after the the conductor region is deposited. Therefore, the openings are provided according to step (c) during or after the conductor region is joined with one of the at least two semiconductor regions. Therefore, the openings are embossed, mechanically cut or laser-cut into the conductor region, which is already joined with the adjacent semiconductor region.

For each of the semiconductor regions, step (a) comprises applying the organic semiconductor material onto a substrate or onto the at least one conductor region in one or more steps. The organic semiconductor material is applied in free-flowing form as a solution, suspension or emulsion comprising the organic semiconductor material, preferably by casting, spraying or printing. Alternatively, the organic semiconductor material is applied in solid form, wherein step (d) comprises applying the organic semiconductor material of at least one of these semiconductor regions into the openings, in particular by casting, and preferably in the course of step (a) of providing the semiconductor regions. The organic semiconductor material is applied in free-flowing form, in particular by spray-coating, knife-coating or other appropriate deposition techniques.

Suitable coating methods for applying the semiconductor material include spin-coating, slot-die coating (also called extrusion coating), curtain coating, reverse gravure coating, blade coating, spray coating and dip coating.

Suitable printing methods for applying the semiconductor material include inkjet printing, flexography printing, gravure printing, in particular forward gravure printing, screen printing, pad printing, offset printing and reverse offset printing.

Spin coating and inkjet printing are the preferred methods. Generally, the same or distinct methods for applying the at least two semiconductor regions. In particular, one of the at least two semiconductor regions can be provided by spin coating and another one of these at least two semiconductor regions can be provided by inkjet printing.

Further, the organic semiconductor material can be applied in solid form, in particular as a solid layer of semiconductor material, which is applied by laminating.

The organic semiconductor material of at least one of these semiconductor regions is applied into the openings, in particular by casting the semiconductor material in liquid form, in particular as a solution. In this way, the openings are filled with semiconductor material in order to provide a physical contact between two semiconductor regions separated by a conductor region comprising the openings. The application of the semiconductor material into the openings can be supported by pressing semiconductor material towards the openings, e.g. by spin-coating or by pressing a surface onto the semiconductor material towards the openings.

When applying the organic semiconductor material in free-flowing form, the semiconductor material is provided as a solution or dispersion of the material in at least one organic solvent. The solution preferably has a content of 0.1 to 20 wt.-% of the organic semiconductor material. Particularly, the content is 0.1 to 8 wt.-%, for example 1 to 8 wt.-%, more particularly 0.5 to 4 wt.-% or 1 to 2 wt.-% of the organic semiconductor material; further advantageous ranges of the semiconductor material are 2 to 6 wt.-%, or 3 to 5 wt.-%. Advantageously, the content of organic semiconductor material does not exceed 10 wt.-% or 8 wt.-%, or even 5 wt.-%, and is at least 0.5 wt.-%, preferably at least 1 wt.-%, more preferably at least 2 wt.-%. The organic solvent may be a single solvent or a binary solvent (i.e. mixture of two or more solvents); it can be used with or without additives. In particular, a dichlorobenzene can be used, preferably 1,2-dichlorobenzene or 1,3-dichlorobenzene. Further, toluene can be used as solvent.

Suitable solvents preparing the formulations according to the present application are organic solvents, in which the DPP polymer and possible additives have satisfactory solubility.

Examples of further suitable organic solvents include, but are not limited to, petroleum ethers, aromatic hydrocarbons such as benzene, chlorobenzene, dichlorobenzene, trichlorobenzene, cyclohexylbenzene, toluene, anisole, xylene, naphthalene, chloronaphtalene, tetraline, indene, indane, cyclooctadiene, styrene, decaline and mesitylene; halogenated aliphatic hydrocarbons such as dichloromethane, chloroform and ethylenechloride; ethers such as dioxane and dioxolane; ketones such as cyclopentanone and cyclohexanone; aliphatic hydrocarbons such as hexanes and cyclohexanes; and mixtures of two or more of said solvents.

Preferred solvents are dichlorobenzene, toluene, xylene, tetraline, chloroform, mesitylene and mixtures of two or more thereof.

Preferably, the organic semiconductor material is applied in free-flowing form, as a solution, in particular as a solution of the semiconductor material in at least one organic solvent, wherein the solution is spin-cast on the substrate, onto which the organic semiconductor material is applied. The substrate and/or the solution can be heated at a temperature of at least 45° C., at least 60° C., and preferably at least 70° C. during the application of the semiconductor material. Further, the temperature of the substrate or the organic semiconductor material during its application does not exceed 150° C., 140° C. or preferably 120° C. In particular, during the application of the semiconductor material, the temperature of the solution and/or the substrate does not exceed the boiling point of the at least one organic solvent. However, the semiconductor material (as well as the substrate, if applicable) is preferably at room temperature during its application.

In order to remove the at least one solvent, the substrate and/or the solution are heated in order to force the evaporation of the at least one solvent. The solvent is removed after the application of the semiconductor material in dissolved form. The heating can be carried out by applying a hot air stream, by directing infrared radiation onto the substrate and/or the solution or by placing the substrate and/or the solution onto a hot plate or into a drying oven. For preferred embodiments, the semiconductor material is applied at room temperature (20° C.). The semiconductor material is dried at a higher temperature, however preferably below the boiling of the solvent. The semiconductor material is preferably dried at a temperature of at least 45° C., at least 60° C., and advantageously at least 70° C. Preferably, the semiconductor material is dried at temperature which does not exceed 150° C., 140° C. or preferably 120° C.

A further embodiment of the inventive method concerns the application of electrodes. In this embodiment, at least two electrodes are applied to end faces of the semiconductor regions by depositing an electrode material onto at least one of the end faces or by providing the electrode material, onto which at least one of the semiconductor materials is applied. The electrode material used therefore is preferably Au, Ag, Pt, Pd, an alloy or a compound of at least two of these metals, or any other conductive material used for the electrodes. The electrode material can be a metal, an alloy of at least two metals, at least one conductive polymer or an at least electrically conducting metal compound. In particular, indium tin oxide (ITO) or other electrically conductive metal compounds can be used. Further, conductive polymers can be used as electrode material, such as PEDOT:PSS or polyaniline. The electrode material can be applied by vapor deposition or can be laminated onto the end faces of the semiconductor regions. Further, the electrode material can be attached to the at least one of the end faces using a conductive adhesive.

In addition, the electrodes can be provided with a contact region facing away from the semiconductor material or can be provided with a conductor attached thereto, which is adapted for providing external contact.

Preferably, the ratio between the inner width of the openings and the thickness of the semiconductor region in which the openings are provided is at least 2, 4, 5, 10 or 20.

The present invention is illustrated by the following examples. Room temperature denotes a temperature from the range 18-23° C., the term "work function" denotes the vacuum work function, and percentages are given by weight (often abbr. wt.-%, or % b.w.), unless otherwise indicated.

EXAMPLES

Example 1

A glass substrate has been provided, onto which a gold electrode with a thickness of 40 nm has been evaporated. Next, a DPP polymer according to Example 1 of WO2010/049321 (HOMO as determined by cyclic voltammetry/Autolab PGSTAT® 30: $|E_H|$=5.35 eV) is applied in form of a solution of 5% of DPP in toluene. The solution containing 5% DPP is spin-cast at 1000 rpm and dried at 90° C. The spin-cast DPP forms a first semiconductor region. In particular, the solution can be dried at a temperature of less than 50° C., or at room temperature (20° C.).

After having applied this first semiconductor region, a conductor region is applied onto the semiconductor region in form of evaporated aluminium with a thickness of 40 nm (work function $|E_C|$=4.3 eV). The evaporated aluminium is provided with openings by nanoimprint lithography. The openings have a diameter of 300-500 nm. The openings are arranged in a grid, wherein the openings have a center to center distance of 2 µm. The ratio of the cross-section area of the openings to the area of the conductor region is 0.196%. The thickness of the first semiconductor region is 1 µm. The conductor layer has been applied by an evaporation technique, in particular by sputtering.

The openings are provided by a nano imprint stamp comprising a silicon wafer. The silicon wafer has a diameter of 100 mm. The stamp comprises projections with a height of ca. 135 nm and a diameter of 350 nm. The projections have a approximately circular cross section. The stamp has been pressed onto the conductor region with a force of 20-80 N, in particular with a force of 20-40 N. This force has been applied to the area of the 100 mm silicon wafer. The resulting depressions within the conductor layer (and the underlying semiconductor layer) have a depth of ca. 100 nm and a width of 300-500 nm. The stamp is pressed into the conductor region at room temperature (20° C.). Preferably, the stamp is pressed into the conductor region at temperatures below 100° C., and in particular below 50° C.

The stamp has been formed by UV lithography, wherein a resist is removed by oxygen plasma. The resulting structure is formed by isotrope dry etching.

After having applied the conductor region in form of a layer of 40 nm aluminium, a solution of 4% of DPP in dichlorobenzene is applied by inkjet-printing. The solution is deposited and dried at 75° C. The resulting semiconductor region had an average thickness of 1 µm.

After having applied the second semiconductor region, an electrode of gold with a thickness of 40 nm was applied by evaporation.

A current of 100 µA was achieved at a gate voltage of 3 V. Further, the mobility was 0.05 cm$^2$Ns. The bulk charge carrier concentration was $2\times10^{15}$ cm$^{-3}$ and the bulk conductivity was 500 Ωm. The thickness of the first semiconductor region was measured using a capacitance method. The mobility was measured with the resulting semiconductor structure in a FET configuration and the bulk charge carrier concentration was measured with a capacity/voltage method in the Schottky contact formed by the conductor region and the first semiconductor region. The transistor had a cross-sectional area of 0.1 mm$^2$ and the total number of openings within the conductor region was 24000.

With a semiconductor structure comprising DPP as semiconductor material and aluminium as conductor material, Schottky contacts could be formed with a bulk charge carrier density of $1\text{-}2\times10^{15}$ cm$^{-3}$ and a forward bias voltage drop of 0.8-0.4 V. Further, a depletion width of 0.3-0.8 µm could be yielded. These results refer to a semiconductor structure with a semiconductor region provided by spin-casting a solution of 4 or 5% of DPP and a conductor region of 33 or 40 nm aluminium. The conductor region was formed of aluminium with openings of 200-500 nm in diameter.

Example 2

In a second example, the conductor region was formed of an evaporated aluminium layer of 40 nm with an inner width of the opening of 200 nm. The openings were arranged in grid with a center to center distance of 500 nm. The semiconductor regions have been produced according to Example 1. In contrast to example 1, the openings in example 2 resulted resulted in a ratio of cross-sectional area of the openings to the area of the conductor region of 0.126. As with Example 1, Example 2 yielded a bulk current density at 3 V of 0.53 A/cm$^2$. The total number of openings in Example 2 was 600000 for an area of 0.16 mm$^2$. As with Example 1, a current of 100 µA at 3 V has been yielded at a thickness of the semiconductor regions of 1 µm measured with a capacitance method. As regards bulk charge carrier concentration, conductivity and mobility, the same results as in Example 1 have been yielded.

In further examples of the invention using DPP as semiconductor material and aluminium as conductor material, charge carrier concentrations of $1.3\times10^{15}$ cm$^{-3}$ as well as a depletion width of 760 nm have been yielded. Further, charge carrier concentrations of $2.3\times10^{15}$ cm$^{-3}$ and a depletion width of 450 nm could be yielded with DPP as semiconductor material and aluminium as conductor material.

BRIEF DESCRIPTION OF THE DRAWING

FIG. 1 shows an inventive semiconductor structure in form of a schematic drawing.

DETAILED DESCRIPTION OF THE FIGURE

In FIG. 1, an embodiment of the inventive semiconductor structure is shown in a sectional side view. The depiction is not drawn to scale, in particular with respect to the widths of the structure elements. The semiconductor structure comprises an electrode 10 with an electrical connection 12. Electrode 10 is made of conducting material. Further, the structure comprises a conductor region 20, which is provided with openings 22. The openings 22 extend perpendicular to the direction along which the conductor region 20 extends. Between the first electrode 10 and the conductor region 20, a first semiconductor region 30 is provided, which extends from the first electrode 10 to the conductor region 20. On the side of the conductor region 20, opposed to the semiconductor region 30, a second semiconductor region 40 is located. Further, a second electrode 50 is provided, together with an electrical connection 52. The second electrode 50 is arranged on the side of the second semiconductor region 40, which is opposed to the conductor region 20 as well as to the first semiconductor region 30. Therefore, the first electrode 10 as well as the second electrode 50 are located at opposed end faces of the semiconductor structure. In particular, the electrodes 10 and 50 are located at end faces of the semiconductor regions 30 and 40, which are opposed to the conductor region 20.

The structure shown in FIG. 1 is a layered structure such that the electrodes 10 and 50, the conductor region 20 as well as the first and the second semiconductor regions 30 and 40 are provided as layers with a constant thickness. The openings 22 are filled with semiconductor material such that the first semiconductor region 30 and the second semiconductor region 40 are physically connected with each other by the semiconductor material within the openings 22. The conductor region 20 can be provided with an electrical connector in order to impose a certain voltage onto the conductor region 20.

For example, if a certain voltage is applied between the second electrode 50 and the conductor region 20, the semiconductor region 40 in-between, i.e. the second semiconductor region, is modified as regards its electrical properties. In particular, the voltage between the conductor region 20 and the second electrode 50 imposes an electrical field within the second semiconductor region 40 which increases the bulk concentration of free charge carriers or their equivalents within the second semiconductor region 40. Thus, if an additional voltage is applied at the electrodes 50 and 10, a current is generated based on the free charge carriers within the semiconductor regions 30, 40, the bulk concentration of which is controlled via the voltage applied at the conductor region 20. In this way, a gain can be produced and the voltage at the conductor region 20 controls a current between the electrical connections 12 and 52 of the first and second electrode 10, 50. In particular, by applying voltage difference between the electrodes 10 and 50, the charge carrier movement is controlled by applying a voltage to the conductor region 20. This voltage varies a depletion range located at the conductor region 20 and the semiconductor region 30. In addition, a depletion range located at the conductor region 20 and the semiconductor region 40 can be varied. In this way, a channel for charge carriers is opened, which travel from the semiconductor region 30 to the semiconductor region 40 through the openings 22. If not voltage is applied to conductor region 20, the depletion range covers the area of 22, and charges do not travel through openings resulting in a transport current between the semiconductor regions 30 and 40 of zero.

According to an exemplifying embodiment, the electrodes 10 and 50 can be formed of a layer of evaporated gold and the first and the second semiconductor region 30, 40 can be provided by layers of DPP, which are preferably produced by casting the organic semiconductor material dissolved in a solvent. Of course, after dissolved organic semiconductor material is applied, the solvent has to be removed before another structural element is applied to the respective semiconductor region 30, 40. The conductor region 20 can be formed of a layer of aluminium, preferably with a thickness of less than 100 nm or less than 50 nm. The openings 22 in the conductor region 20 are provided by nanoimprinting lithography into a layer of aluminium, which provides the conductor region 20 and which is formed by evaporation of aluminium onto one of the semiconductor regions 30 or 40. The openings 22 have an inner width of e.g. 500 nm.

REFERENCE SIGNS 10 first electrode
12 electrical connection
20 conductor region
22 openings
30 first semiconductor region
40 second semiconductor region
50 second electrode
52 electrical connection

CITED DOCUMENTS

WO 2010/049321
WO 2008/000664
US 2006/0086933 A1
US 2009/0001362 A1
Yu-Chiang Chao et. al., "High-performance solution-processed polymer space-charge-limited transistor", Organic Electronics 9 (2008), pp. 310-316
Yasuyuki Watanabe et. al., "Characteristics of organic inverters using vertical- and lateral-type organic transistors", Thin Solid Films 516 (2008), pp. 2731-2734
US 2005/0196895 A1
US 2009/0042142 A1
U.S. Pat. No. 6,451,459 B1
WO 05/049695
WO 2010/049323
PCT/EP2010/053655
PCT/EP2010/054152
PCT/EP2010/056778
PCT/EP2010/056776

The invention claimed is:

1. A semiconductor structure, comprising at least one conductor region and at least two semiconductor regions which are partly separated by the at least one conductor region,
    wherein:
        the at least one conductor region comprises openings extending between the semiconductor regions;

at least one of the semiconductor regions comprises a diketopyrrolopyrrole polymer as semiconductor material;

the semiconductor regions comprise at least one organic semiconductor material having a highest occupied molecular orbital energy level $E_H$ defined by:

5.0 eV≤|$E_H$|≤5.8 eV;

the conductor region comprises a conductive material having a work function $E_C$ defined by:

|$E_H$|−1.5 eV≤|$E_C$|≤|$E_H$|−0.4 eV; and contacts between each of the at least one conductor region and each of the at least one semiconductor region are Schottky contacts.

2. The semiconductor structure of claim 1, wherein a bulk concentration of positive charge carrier equivalents $N_p$ of the organic semiconductor material satisfies:

$N_p$≤2.3×10$^{15}$ cm$^{-3}$.

3. The semiconductor structure of claim 2, wherein $E_H$, $E_C$, and $N_p$ are adapted to yield a depletion width $I_d$ of more than 100 nm within the semiconductor region.

4. The semiconductor structure of claim 1, wherein the at least one organic semiconductor material comprises a diketopyrrolopyrrole (DPP) polymer having one or more DPP skeletons represented by the following formula:

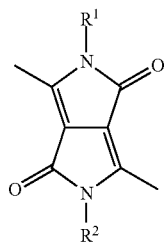

in the repeating unit, wherein:
$R^1$ and $R^2$ are the same or different from each other and are selected from the group consisting of hydrogen; a $C_1$-$C_{100}$ alkyl group; —COORS; a $C_1$-$C_{100}$ alkyl group which is substituted by one or more halogen atoms, hydroxyl groups, nitro groups, —CN, or $C_6$-$C_{18}$ aryl groups and/or interrupted by —O—, —COO—, —OCO—, or —S—; a $C_7$-$C_{100}$ arylalkyl group; a carbamoyl group; a $C_5$-$C_{12}$ cycloalkyl group which can be substituted one to three times with a $C_1$-$C_8$ alkyl group and/or a $C_1$-$C_8$ alkoxy group; a $C_6$-$C_{24}$ aryl group; and pentafluorophenyl; and
$R^3$ is a $C_1$-$C_{50}$ alkyl group.

5. The semiconductor structure of claim 4, wherein the DPP polymer is selected from the group consisting of a polymer of formula (Ia):

 (Ia)

a copolymer of formula (Ib):

 (Ib)

a copolymer of formula (Ic):

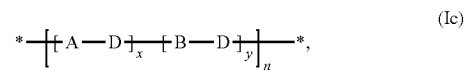 (Ic)

and
a copolymer of formula (Id):

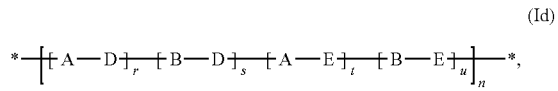 (Id)

wherein:
x=0.995 to 0.005;
y=0.005 to 0.995;
with the proviso that x+y=1;
r=0.985 to 0.005;
s=0.005 to 0.985;
t=0.005 to 0.985;
u=0.005 to 0.985;
with the proviso that r+s+t+u=1;
n=4 to 1000;
A is a group of formula:

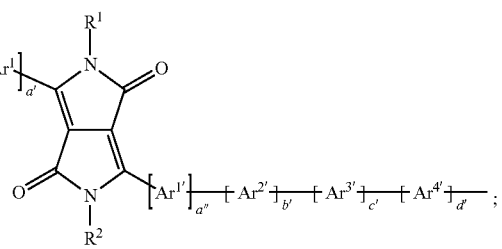 (X)

a'=1, 2, or 3;
a"=0, 1, 2, or 3;
b=0, 1, 2, or 3;
b'=0, 1, 2, or 3;
c=0, 1, 2, or 3;
c'=0, 1, 2, or 3;
d=0, 1, 2, or 3;
d'=0, 1, 2, or 3;
with the proviso that b' is not 0 if a" is 0;
$Ar^1$, $Ar^{1'}$, $Ar^2$, $Ar^{2'}$, $Ar^3$, $Ar^{3'}$, $Ar^4$ and $Ar^{4'}$ are independently of each other heteroaromatic or aromatic rings, which optionally can be condensed and/or substituted;

$R^{112}$ and $R^{113}$ are independently of each other H; $C_6$-$C_{18}$ aryl; $C_6$-$C_{18}$ aryl which is substituted by $C_1$-$C_{18}$ alkyl, or $C_1$-$C_{18}$ alkoxy; $C_1$-$C_{18}$ alkyl; or $C_1$-$C_{18}$ alkyl which is interrupted by —O—;

B, D and E are independently of each other a group of formula:

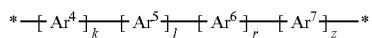

or the formula (X), with the proviso that in case B, D and E are a group of formula (X), they are different from A;
k=1;
=0 or 1;
r=0 or 1;
z=0 or 1;
$Ar^4$, $Ar^5$, $Ar^6$ and $Ar^7$ are independently of each other a group of formula:

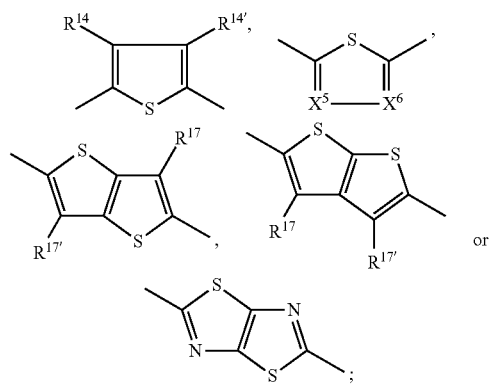

one of $X^5$ and $X^6$ is N and the other is $CR^{14}$;
$R^{14}$, $R^{14'}$, $R^{17}$ and $R^{17'}$ are independently of each other H, or a $C_1$-$C_{25}$ alkyl group, which may optionally be interrupted by one or more oxygen atoms.

6. The semiconductor structure of claim 5, wherein the DPP polymer is a polymer according to formula (Ib-1), (Ib-9), or (Ib-10):

(Ib-1)

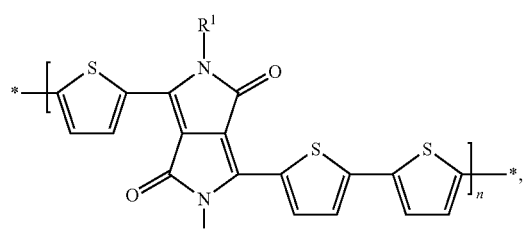

(Ib-9)

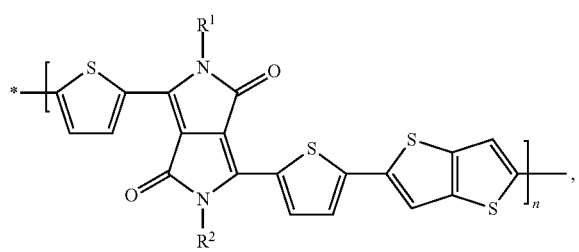

(Ib-10)

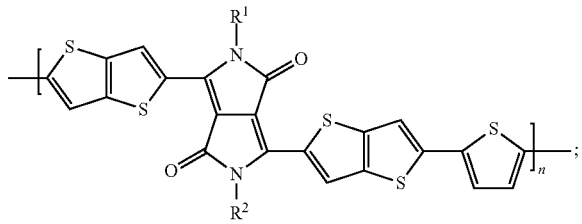

$R^1$ and $R^2$ are independently from each other a $C_8$-$C_{36}$ alkyl group; and
n=4 to 1000.

7. The semiconductor structure of claim 4, wherein:
$Ar^1$, $Ar^{1'}$, $Ar^2$, $Ar^{2'}$, $Ar^3$, $Ar^{3'}$, $Ar^4$ and $Ar^{4'}$ are independently of each other:

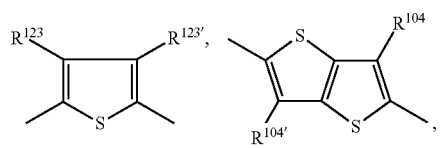

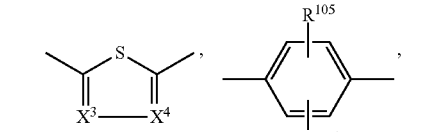

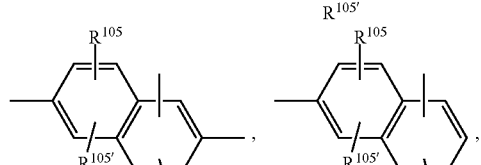

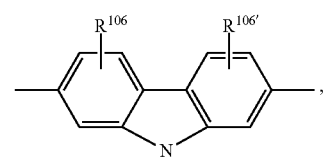

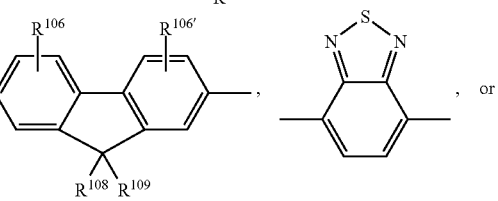

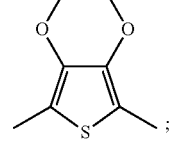

one of $X^3$ and $X^4$ is N and the other is $CR^{99}$;
$R^{99}$, $R^{104}$, $R^{104'}$, $R^{123}$ and $R^{123'}$ are independently of each other hydrogen, halogen, especially F, or a $C_1$-$C_{25}$ alkyl group, especially a $C_4$-$C_{25}$ alkyl, which may optionally be interrupted by one or more oxygen or sulphur atoms, $C_7$-$C_{25}$ arylalkyl, or a $C_1$-$C_{25}$ alkoxy group;

$R^{105}$, $R^{105'}$, $R^{106}$ and $R^{106'}$ are independently of each other hydrogen, halogen, $C_1$-$C_{25}$ alkyl, which may optionally be interrupted by one or more oxygen or sulphur atoms; $C_7$-$C_{25}$ arylalkyl, or $C_1$-$C_{18}$ alkoxy;

$R^{107}$ is $C_7$-$C_{25}$ arylalkyl, $C_6$-$C_{18}$ aryl; $C_6$-$C_{18}$ aryl which is substituted by $C_1$-$C_{18}$ alkyl, $C_1$-$C_{18}$ perfluoroalkyl, or $C_1$-$C_{18}$ alkoxy; $C_1$-$C_{18}$ alkyl; $C_1$-$C_{18}$ alkyl which is interrupted by —O—, or —S—; or —COOR$^{124}$, $R^{124}$ is $C_1$-$C_{25}$ alkyl group, especially a $C_4$-$C_{25}$ alkyl, which may optionally be interrupted by one or more oxygen or sulphur atoms, $C_7$-$C_{25}$ arylalkyl;

$R^{108}$ and $R^{109}$ are independently of each other H, $C_1$-$C_{25}$ alkyl, $C_1$-$C_{25}$ alkyl which is substituted by E and/or interrupted by D, $C_7$-$C_{25}$ arylalkyl, $C_6$-$C_{24}$ aryl, $C_6$-$C_{24}$ aryl which is substituted by G, $C_2$-$C_{20}$ heteroaryl, $C_2$-$C_{20}$ heteroaryl which is substituted by G, $C_2$-$C_{18}$ alkenyl, $C_2$-$C_{18}$ alkynyl, $C_1$-$C_{18}$ alkoxy, $C_1$-$C_{18}$ alkoxy which is substituted by E and/or interrupted by D, or $C_7$-$C_{25}$ aralkyl; or $R^{108}$ and $R^{109}$ together form a group of formula =CR$^{110}$R$^{111}$, wherein $R^{110}$ and $R^{111}$ are independently of each other H, $C_1$-$C_{18}$ alkyl, $C_1$-$C_{18}$ alkyl which is substituted by E and/or interrupted by D, $C_6$-$C_{24}$ aryl, $C_6$-$C_{24}$ aryl which is substituted by G, or $C_2$-$C_{20}$ heteroaryl, or $C_2$-$C_{20}$ heteroaryl which is substituted by G; or $R^{108}$ and $R^{109}$ together form a five or six-membered ring, which optionally can be substituted by $C_1$-$C_{18}$ alkyl, $C_1$-$C_{18}$alkyl which is substituted by E and/or interrupted by D, $C_6$-$C_{24}$ aryl, $C_6$-$C_{24}$ aryl which is substituted by G, $C_2$-$C_{20}$ heteroaryl, $C_2$-$C_{20}$ heteroaryl which is substituted by G, $C_2$-$C_{18}$ alkenyl, $C_2$-$C_{18}$ alkynyl, $C_1$-$C_{18}$ alkoxy, $C_1$-$C_{18}$ alkoxy which is substituted by E and/or interrupted by D, or $C_7$-$C_{25}$ aralkyl;

D is —CO—, —COO—, —S—, —O—, or —NR$^{112}$—;
E is $C_1$-$C_8$ thioalkoxy, $C_1$-$C_8$ alkoxy, CN, —NR$^{112}$R$^{113}$, —CONR$^{112}$R$^{113}$, or halogen; and
G is E, or $C_1$-$C_{18}$ alkyl.

8. The semiconductor material of claim 1, wherein the organic semiconductor material has a polydispersity in the range of from 1.01 to 10.

9. The semiconductor structure of claim 1, wherein the openings have an inner width of more than 200 nm.

10. The semiconductor structure of claim 1, wherein the conductive material comprises a metal, an alloy, or a conductive polymer.

11. The semiconductor structure of claim 1, further comprising at least two electrodes at end faces of the semiconductor regions, and wherein the electrodes as well as the conductor region each comprise a contact region or are provided with a conductor adapted for external contact.

12. The semiconductor structure of claim 1, wherein:
the semiconductor regions are in direct contact with each other through the openings of the conductor region; and
the semiconductor regions are separated by the conductor region by sections of the conductor region, which sections are lateral to the openings.

13. The semiconductor structure of claim 1, comprising a conductor region partly separating two semiconductor regions, wherein:
the conductor region and the two semiconductor regions provide a vertical transistor structure; and
the conductor region provides a gate adapted for conductivity control between the semiconductor regions.

14. A method for producing the semiconductor structure according to claim 1, the method comprising:
(a) providing at least two semiconductor regions comprising at least one organic semiconductor material;
(b) providing at least one conductor region between the at least two semiconductor regions;
(c) providing openings in the at least one conductor region extending through the entire conductor region; and
(d) partly contacting the at least two semiconductor regions through the openings of the at least one conductor region,
wherein:
the organic semiconductor material of (a) has a HOMO (highest occupied molecular orbital) energy level $E_H$ defined by:

$$5.0 \text{ eV} \leq |E_H| \leq 5.8 \text{ eV}; \text{ and}$$

the at least one conductor region provided in (b) comprises a conductive material having a work function $E_C$ defined by:

$$|E_H|-1.5 \text{ eV} \leq |E_C| \leq |E_H|-0.4 \text{ eV}.$$

15. The method of claim 14, comprising:
(b) providing the at least one conductor region as a continuous layer of the conductive material; and
(c) embossing, mechanically cutting or laser cutting the openings with an inner width of the openings of more than 200 nm through the continuous layer.

16. A semiconductor structure, comprising at least one conductor region and at least two semiconductor regions which are partly separated by the at least one conductor region,
wherein:
the at least one conductor region comprises openings extending between the semiconductor regions;
the semiconductor regions comprise at least one organic semiconductor material which is a diketopyrrolopyrrole (DPP) polymer;
the conductor region comprises a metal selected from the group consisting of Al, Cr, Cu, Fe, In, Sb, Si, Sn, and Zn; and
contacts between each of the at least one conductor region and each of the at least one semiconductor region are Schottky contacts.

* * * * *